United States Patent (10) Patent No.: US 7,989,123 B2
Lee et al. (45) Date of Patent: Aug. 2, 2011

(54) PHOTOMASK INCLUDING ION TRAPPING LAYER AND METHOD OF MANUFACTURING SEMICONDUCTOR DEVICE USING THE PHOTOMASK

(75) Inventors: Han-shin Lee, Hwaseong-si (KR);
Jae-hyuck Choi, Yongin-si (KR);
Hae-young Jeong, Suwon-si (KR);
Hyung-ho Ko, Hwaseong-si (KR);
Jin-sik Jung, Seoul (KR); Jong-keun Oh, Seoul (KR); Soo-jung Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 12/456,500

(22) Filed: Jun. 17, 2009

(65) Prior Publication Data

US 2010/0068631 A1 Mar. 18, 2010

(30) Foreign Application Priority Data

Sep. 18, 2008 (KR) ........................ 10- 2008-0091615

(51) Int. Cl.
*G03F 1/00* (2006.01)

(52) U.S. Cl. .......................................................... 430/5

(58) Field of Classification Search .............. 430/5, 313, 430/319; 428/615, 687
See application file for complete search history.

(56) References Cited

U.S. PATENT DOCUMENTS

| 5,527,731 | A * | 6/1996 | Yamamoto et al. ........ 250/492.3 |
| 7,073,969 | B2 | 7/2006 | Kamm |
| 2003/0138656 | A1 * | 7/2003 | Sparks .......................... 428/615 |
| 2005/0233408 | A1 * | 10/2005 | Pouwels et al. .................. 435/34 |

FOREIGN PATENT DOCUMENTS

| KR | 10-2008-0001023 A | 1/2008 |
| KR | 10-2008-0019996 A | 3/2008 |

\* cited by examiner

*Primary Examiner* — Stephen Rosasco

(74) *Attorney, Agent, or Firm* — Mills & Onello, LLP

(57) ABSTRACT

A photomask includes an ion trapping layer and a method of manufacturing a semiconductor device uses the photomask. The photomask includes a transparent substrate and an ion trapping layer formed on a first region of the transparent substrate to trap ions present near the transparent substrate. In manufacturing a semiconductor device, a photosensitive film formed on a substrate is exposed through the photomask in which the ion trapping layer is formed on the transparent substrate, and the substrate is processed using the photosensitive film obtained as the result of the exposure.

22 Claims, 9 Drawing Sheets

PHOTOMASK INCLUDING ION TRAPPING LAYER AND METHOD OF MANUFACTURING SEMICONDUCTOR DEVICE USING THE PHOTOMASK

CROSS-REFERENCE TO RELATED APPLICATIONS

This application claims the benefit of Korean Patent Application No. 10-2008-0091615, filed on Sep. 18, 2008, in the Korean Intellectual Property Office, the contents of which are herein incorporated by reference in their entirety.

BACKGROUND OF THE INVENTION

1. Field of the Invention

The inventive concept relates to an apparatus for manufacturing a semiconductor device and a method of manufacturing a semiconductor device using the apparatus. More particularly, the inventive concept relates to a photomask that is used for an exposure process in a photolithographic process and a method of manufacturing a semiconductor device using the photomask.

2. Description of the Related Art

As the integration density of semiconductor devices increases, the size of patterns to be realized on a substrate is reduced. In order to form minute patterns on a substrate, a wavelength of light that is used in a photolithographic process is required to be very short. As the wavelength of light used in an exposure process is shortened, an energy applied to a surface of a photomask is increased. Accordingly, in an exposure process in which a light source having a relatively low exposure energy and a relatively long wavelength is used, an opto-chemical reaction of ions which have not chemically reacted and are present on the surface of the photomask or are present around the photomask is actively progressed. The opto-chemical reaction results due to a high energy that is applied during an exposure process in which an ArF Excimer laser (193 nm) or a short-wavelength light source having a wavelength shorter than the ArF Excimer laser is used. As a result of the opto-chemical readtion, haze defects, which are photo-induced defects caused by light, may be generated on the photomask. Haze defects generated on the surface of the photomask adversely affect transmission of light in an exposure process; that is, haze defects cause variation in exposure energy irradiated to a substrate. Thus, patterns cannot be properly formed on the substrate, thereby reducing a process yield.

SUMMARY

The inventive concept provides a photomask having a structure that prevents haze defects in an exposure process of a photolithographic process.

The inventive concept also provides a method of manufacturing a semiconductor device which reduces the possibility of pattern failure due to haze defects on a photomask during an exposure process by performing the exposure process using the above-described photomask.

According to one aspect of the inventive concept, there is provided a photomask which includes a transparent substrate and an ion trapping layer formed on a first region of the transparent substrate to trap ions present near the transparent substrate.

In one embodiment, the transparent substrate has a first transmittance with respect to light, the first region of the transparent substrate on which the ion trapping layer is formed has a second transmittance with respect to the light and the second transmittance has a value within a range of ±1% of the first transmittance.

In one embodiment, the ion trapping layer has a thickness D in the range of $0 < D \leq 1$ nm.

In one embodiment, the ion trapping layer includes a thin film that completely covers the first region of the transparent substrate. In one embodiment, the ion trapping layer includes a plurality of island-type thin films disposed apart from each other on the first region of the transparent substrate.

In one embodiment, the first region of the transparent substrate includes the entirety of a main surface of the transparent substrate. In one embodiment, the first region of the transparent substrate includes a portion of the main surface of the transparent substrate.

In one embodiment, the photomask includes a transmission control pattern that is formed on the first region of the transparent substrate. The transmission control pattern includes a material different from the material used to form the transparent substrate. In another embodiment, the transmission control pattern includes at least one pattern selected from the group consisting of a light shielding pattern and a phase shift pattern. In another embodiment, the ion trapping layer is formed on the transmission control pattern. In another embodiment, the ion trapping layer is formed to simultaneously cover an exposed surface of the transparent substrate and an exposed surface of the transmission control pattern. In another embodiment, the ion trapping layer is interposed between the transparent substrate and the transmission control pattern.

In one embodiment, the first region of the transparent substrate includes a phase shift unit that has a trench shape and has a bottom surface lower than a top surface of the first region. In one embodiment, the ion trapping layer is formed respectively on the top surface of the first region of the transparent substrate and on the bottom surface of the phase shift unit.

In one embodiment, the ion trapping layer is a metal, a metal oxide, a conductive polymer, or a ceramic. In the embodiment in which the ion trapping layer is a metal or a metal oxide, the ion trapping layer includes a metal selected from the group consisting of Cr, Pt, Cu, Ni, Au, Ag, Mg, Co, Zn, Al, oxides of these metals and a combination thereof. In the embodiment in which the ion trapping layer is a conductive polymer, the ion trapping layer is at least one of (poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), and poly(para-phenylene vinylene)s. In the embodiment in which the ion trapping layer is ceramic, the ion trapping layer is SrFeCoO, (La, Sr)(Co, Fe)O, or BiSrCrCuO According to another aspect of the inventive concept, there is provided a method of manufacturing a semiconductor device which includes: forming a photosensitive film on a substrate; exposing the photosensitive film through a photomask that includes a transparent substrate and an ion trapping layer formed on a first region of the transparent substrate to trap ions present near the transparent substrate; forming a photosensitive film pattern by developing the exposed photosensitive film; and processing the substrate using the photosensitive film pattern.

In one embodiment the exposing of the photosensitive film is performed using a KrF Excimer laser (248 nm), an ArF Excimer laser (193 nm), a $F_2$ Excimer laser (157 nm), or light in an Extreme-ultraviolet (EUV) region.

In one embodiment, the processing of the substrate is performed using one process selected from the group consisting of etching the substrate, injecting ions into the substrate, depositing a process material on the substrate, and cleaning the substrate.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
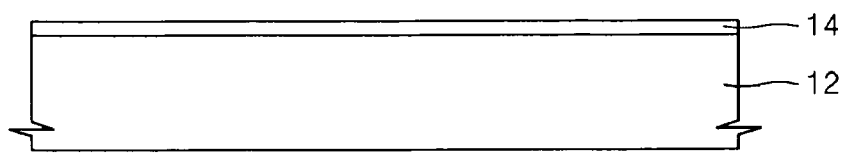
FIG. 1 is a cross-sectional view illustrating a configuration of a photomask according to an embodiment of the present inventive concept.

Example embodiments are described more fully with reference to the accompanying drawings in which exemplary embodiments of the inventive concept are illustrated.

During a photolithographic process for manufacturing a semiconductor device, one of the main causes of haze defects being formed on a surface of a photomask is sulfur or ammonium group ions that remain on the surface of the photomask or near the photomask. The sulfur ions and the ammonium group ions are included in a cleaning solution used for cleaning the photomask, and are used in a process of manufacturing a pellicle frame, which is used for increasing the lifetime of the photomask and for protecting the photomask from external particles. Also, even when another cleaning solution that does not include sulfur, which can provide excellent cleaning capability, is used, it is very difficult to completely prevent the photomask from being exposed to sulfur.

Example embodiments of the present inventive concept provide a photomask having a structure in which an exposure process can be performed under an optimum condition by effectively extending a time during which haze defects are generated during the exposure process for manufacturing a semiconductor device. The exposure process can even be performed under an environment in which various contaminants that may result in haze defects on a surface of the photomask during the exposure process for manufacturing the semiconductor device exist.

In a photolithographic process for manufacturing a semiconductor device, a photomask according to an embodiment of the present inventive concept may be used for an exposure process, wherein the photomask includes a transparent substrate and an ion trapping layer that is formed on a first region of the transparent substrate for trapping ions around the transparent substrate.

The photomask that includes the ion trapping layer is not limited in function and structure, and can be any type of well-known photomask in the art. For example, the photomask may be a binary mask (BM) comprising a quartz substrate and a chrome pattern or a phase shift mask (PSM). In particular, the photomask may be a rim-shift-PSM in which a phase shift material film pattern is formed on an optical shielding pattern that is formed of chrome, a PSM in which the optical shielding chrome pattern is replaced by a half-tone film so that light which has induced and generated a phase shift can be transmitted with an appropriate transmittance, an attenuated PSM (attPSM) in which a film formed of Mo is added to an existing BM, a half-tone PSM, an alternating-PSM (ALT-PSM) in which phase shift material films are alternately formed on a transmitting region of a quartz substrate, or a chromeless phase shift mask in which a trench for phase shifting is formed on a transmitting region of a quartz substrate.

A configuration of a photomask according to an embodiment of the present inventive concept is described herein in detail with reference to practical examples thereof.

FIG. 1 is a cross-sectional view illustrating a configuration of a photomask 10 according to an embodiment of the present inventive concept.

Referring to FIG. 1, the photomask 10 according to the current embodiment of the present inventive concept includes a transparent substrate 12 and an ion trapping layer 14 formed on a predetermined region of the transparent substrate 12 in order to trap ions, for example, sulfur ions and/or ammonium group ions, present on a surface of the transparent substrate 12 and/or near the transparent substrate 12.

In FIG. 1, the ion trapping layer 14 has a thin film shape completely covering a main surface of the transparent substrate 12. However, the present inventive concept is not limited thereto. For example, the ion trapping layer 14 may be formed on a portion of the main surface of the transparent substrate.

The ion trapping layer 14 may be formed to have a thickness sufficiently thin so as not to affect the transmittance of the transparent substrate 12. For example, the ion trapping layer 14 may be formed to a thickness D in a range of $0 < D \leq 1$ nm. For example, if the transparent substrate 12 has a first transmittance, a first region of the transparent substrate 12 on which the ion trapping layer 14 is formed may have a second transmittance having a value in a range of ±1% of the first transmittance of the transparent substrate 12.

The ion trapping layer 14 may be formed on a portion of the main surface of the transparent substrate 12 or on the entire main surface of the transparent substrate 12.

The transparent substrate 12 may be formed of quartz.

The ion trapping layer 14 may be formed of a metal, a metal oxide, a conductive polymer, or a ceramic.

In the embodiment in which the ion trapping layer 14 is formed of a metal or a metal oxide, the ion trapping layer 14 may be formed of, for example, one of Cr, Pt, Cu, Ni, Au, Ag, Mg, Co, Zn, Al, or oxides of these metals, or a combination thereof.

In the embodiment in which the ion trapping layer 14 is formed of a conductive polymer, the ion trapping layer 14 may be formed of, for example, poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), or poly(para-phenylene vinylene)s.

In the embodiment in which the ion trapping layer 14 is formed of a ceramic, the ion trapping layer 14 may be formed of SrFeCoO, (La, Sr)(Co, Fe)O or BiSrCrCuO.

In forming the photomask 10 of FIG. 1, a material for forming the ion trapping layer 14 is deposited to a desired thickness on the transparent substrate 12 using a physical vapor deposition (PVD) method such as evaporation or sputtering, a chemical vapor deposition (CVD) method, an atomic layer deposition (ALD) method, or a spin coating method.

Figure 2:
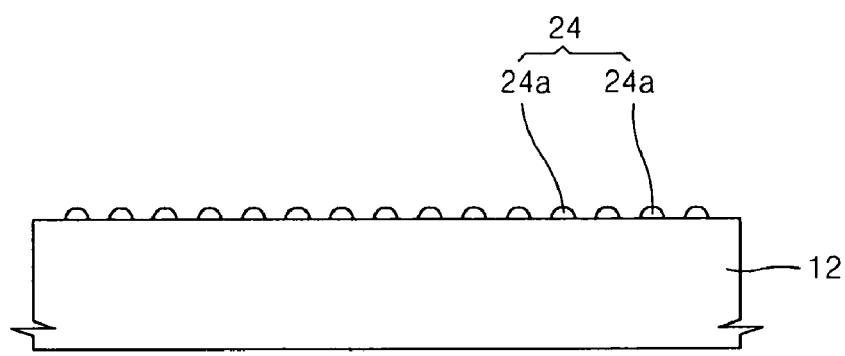
FIG. 2 is a cross-sectional view illustrating a configuration of a photomask according to another embodiment of the present inventive concept.

FIG. 2 is a cross-sectional view illustrating a configuration of a photomask 20 according to another embodiment of the present inventive concept. In FIG. 2, like reference numerals refer to the like elements of the photomask 10 of FIG. 1.

The photomask 20 of FIG. 2 is similar to the photomask 10 of FIG. 1. However, the photomask 20 according to the present embodiment of FIG. 2 includes an ion trapping layer 24 formed on a predetermined portion of the transparent substrate 12 in order to trap ions present on the transparent substrate 12. The ion trapping layer 24 has a similar configuration to that of the ion trapping layer 14 of FIG. 1 except that the ion trapping layer 24 comprises a plurality of island-type thin films 24a disposed apart from each other on the main surface of the transparent substrate 12.

In forming the photomask 20 of FIG. 2, a plurality of island-type thin films 24a are formed by depositing a material for forming the ion trapping layer 24 on the transparent substrate 12 using a PVD process such as evaporation or sputtering. Alternatively, as illustrated in FIG. 1, after forming the ion trapping layer 14 that entirely covers the main surface of the transparent substrate 12 on the transparent substrate 12, the ion trapping layer 24 including a plurality of island-type thin films 24a may be formed by selectively removing a portion of the ion trapping layer 14, as illustrated in FIG. 2.

Figure 3:
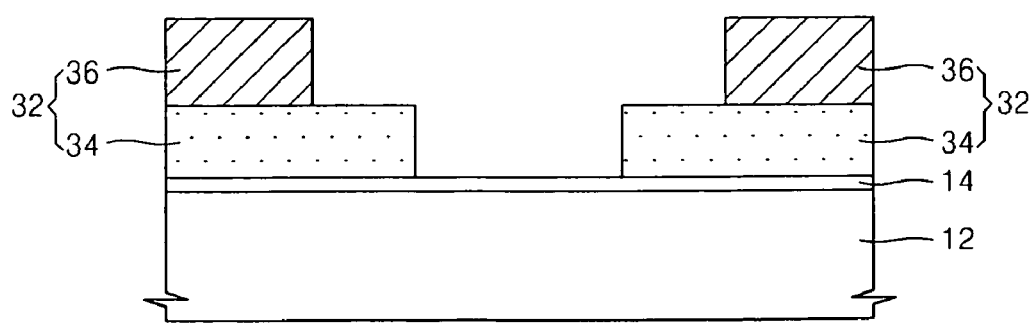
FIG. 3 is a cross-sectional view illustrating a configuration of a photomask according to another embodiment of the present inventive concept.

FIG. 3 is a cross-sectional view illustrating a configuration of a photomask 30 according to another embodiment of the present inventive concept. In FIG. 3, the configuration of the photomask 30 having a phase shift mask structure is illustrated. Like reference numerals refer to like elements of the photomask 10 of FIG. 1.

Referring to FIG. 3, the photomask 30 according to the embodiment of FIG. 3 includes a transparent substrate 12, an ion trapping layer 14 formed on the transparent substrate 12 in order to trap ions present on the transparent substrate 12, and a transmission control pattern 32 that is formed on the ion trapping layer 14. The transmission control pattern is formed of a material different from the material used to form the transparent substrate 12.

In FIG. 3, the transmission control pattern 32 includes a phase shift pattern 34 and a light shielding pattern 36, which are sequentially stacked on the transparent substrate 12 and the ion trapping layer 14. The phase shift pattern 34 and the light shielding pattern 36 may be formed of MoSiON and Cr, respectively. The structure of the transmission control pattern 32 is not limited to the structure illustrated in FIG. 3. The transmission control pattern 32 may have various structures according to the intended purpose for the transmission control pattern 32.

In FIG. 3, the photomask 30 has a structure in which the ion trapping layer 14 is interposed between the transparent substrate 12 and the transmission control pattern 32. However, this embodiment of the present inventive concept is not limited thereto. For example, the ion trapping layer 14 may be formed to be disposed between the phase shift pattern 34 and the light shielding pattern 36.

In forming the photomask 30 of FIG. 3, after forming the ion trapping layer 14 on the transparent substrate 12, a series of processes are performed. A first material layer for forming the phase shift pattern 34 and a second material layer for forming the light shielding pattern 36 are sequentially formed on the ion trapping layer 14, and subsequently, the first and second material layers are patterned to form the phase shift pattern 34 and the light shielding pattern 36. Alternatively, a first material for forming the phase shift pattern 34 is formed and patterned to form the phase shift pattern 34, and subsequently a second material for forming the light shielding pattern 36 is formed and patterned to form the light shielding pattern 36.

Figure 4:
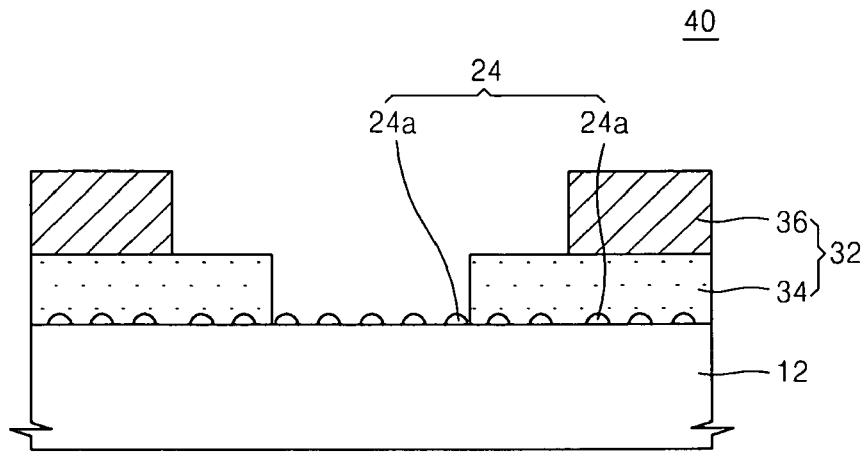
FIG. 4 is a cross-sectional view illustrating a configuration of a photomask according to another embodiment of the present inventive concept.

FIG. 4 is a cross-sectional view illustrating a configuration of a photomask 40 according to another embodiment of the present inventive concept. In FIG. 4, the photomask 40 has a phase shift mask structure similar to the photomask 30 of FIG. 3. In FIG. 4, like reference numerals refer to like elements of FIGS. 1 through 3, and thus, detailed descriptions thereof will not be repeated.

Referring to FIG. 4, the photomask 40 according to the current embodiment of the present inventive concept, similar to the photomask 20 of FIG. 2, includes a transparent substrate 12, an ion trapping layer 24 formed on the transparent substrate 12 in order to trap ions present on the transparent substrate 12, and, similar to the photomask 30 of FIG. 3, a transmission control pattern 32 formed on the ion trapping layer 24. The transmission control pattern 32 is formed of a material different from the material used to form the transparent substrate 12. The transmission control pattern 32 includes a phase shift pattern 34 and a light shielding pattern 36 sequentially stacked on the transparent substrate 12.

In the embodiment of FIG. 4, the ion trapping layer 24 comprises a plurality of island-type thin films 24a disposed apart from each other between the transparent substrate 12 and the transmission control pattern 32.

In FIG. 4, the photomask 40 has a structure in which the ion trapping layer 24 is interposed between the transparent substrate 12 and the transmission control pattern 32. However, this embodiment of the present inventive concept is not limited thereto, and the ion trapping layer 24 may be formed to be interposed between the phase shift pattern 34 and the light shielding pattern 36.

Figure 5A:
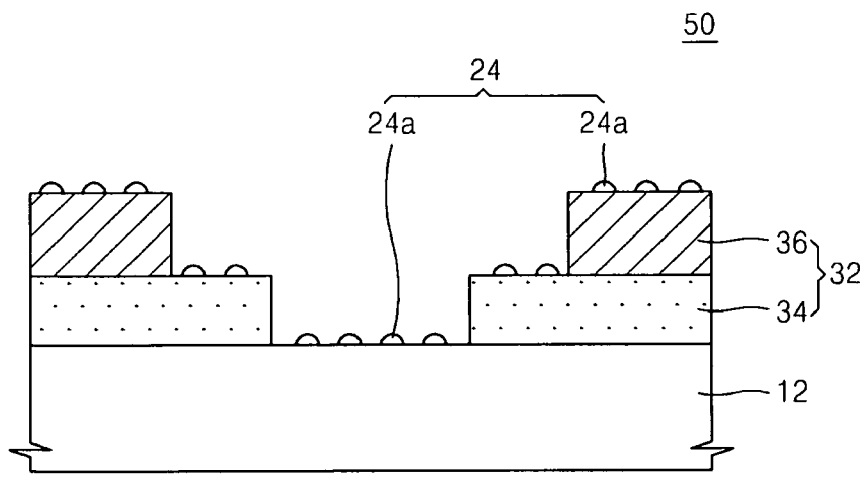
FIGS. 5A and 5B are cross-sectional views illustrating configurations of a photomask according to another embodiment of the present inventive concept.

FIG. 5A is a cross-sectional view illustrating a configuration of a photomask 50 according to another embodiment of the present inventive concept. In FIG. 5A, the photomask 50 has a phase shift mask structure similar to the photomask 30 of FIG. 3. In FIG. 5A, like reference numerals refer to like elements of FIGS. 1 through 4, and thus, detailed descriptions thereof will not be repeated.

Referring to FIG. 5A, the photomask 50 according to the embodiment of FIG. 5A, similar to the photomasks 30 and 40 illustrated in FIGS. 3 and 4, includes a transparent substrate 12 and a transmission control pattern 32 formed on the transparent substrate 12. The transmission control pattern 32 is formed of a material different from the material used to form the transparent substrate 12. The transmission control pattern 32 includes a phase shift pattern 34 and a light shielding pattern 36 sequentially stacked on the transparent substrate 12. However, in the embodiment of FIG. 5A, an ion trapping layer 24 for trapping ions present on a surface of the photomask 50 or near the photomask 50 is formed to simultaneously cover an exposed surface of the transparent substrate 12 and an exposed surface of the transmission control pattern 32 including the exposed surfaces of the phase shift pattern 34 and the light shielding pattern 36. The ion trapping layer 24 illustrated in FIG. 5A comprises a plurality of island-type thin films 24a disposed apart from each other on the exposed surface of the transparent substrate 12 and the exposed surface of the transmission control pattern 32 similar to the ion trapping layer 24 of FIG. 2.

Figure 5B:
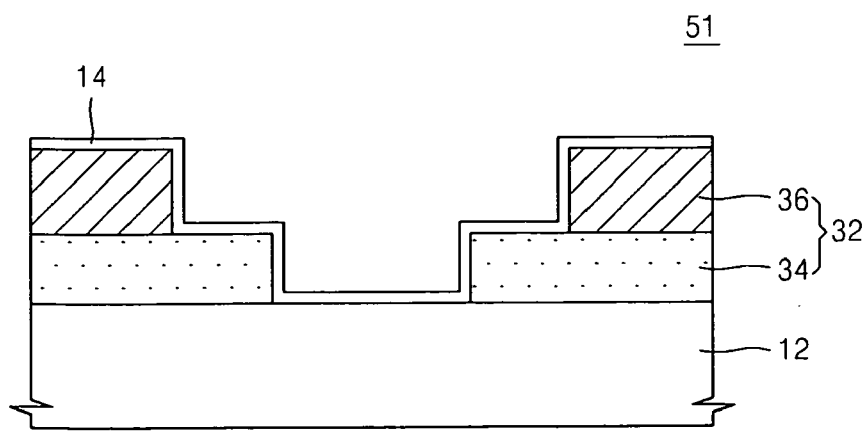

In FIG. 5A, the ion trapping layer 24 comprises a plurality of island-type thin films 24a like the ion trapping layer 24 illustrated in FIG. 2; however, this embodiment of the present inventive concept is not limited thereto. For example, as illustrated in FIG. 5B, instead of the ion trapping layer 24 illustrated in FIG. 5A, a photomask 51, includes the ion trapping layer 14 having a film shape as illustrated in FIG. 1 formed on the entire exposed surface of the transparent substrate 12 and the entire exposed surface of the transmission control pattern 32.

Figure 6:
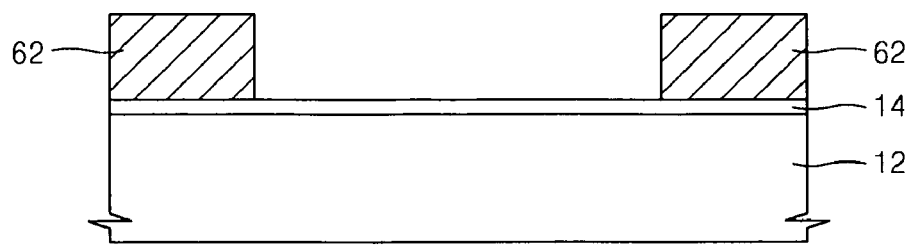
FIG. 6 is a cross-sectional view illustrating a configuration of a photomask according to another embodiment of the present inventive concept.

FIG. 6 is a cross-sectional view illustrating a configuration of a photomask 60 according to another embodiment of the present inventive concept. In FIG. 6, the photomask 60 has a binary mask (BM) structure that includes of a transparent substrate 12 and a light shielding pattern 62. In FIG. 6, like reference numerals refer to like elements of FIGS. 1 through 5, and thus, detailed descriptions thereof will not be repeated.

Referring to FIG. 6, the photomask 60 according to the embodiment of FIG. 6 of the present inventive concept includes a transparent substrate 12, an ion trapping layer 14 formed on the transparent substrate 12 which traps ions present on the photomask 60, and a light shielding pattern 62 formed on the ion trapping layer 14. The light shielding pattern 62 may be formed of Cr.

In FIG. 6, the photomask 60 has a structure in which the ion trapping layer 14 having a film shape that entirely covers the transparent substrate 12 like the ion trapping layer 14 illustrated in FIG. 1 is interposed between the transparent substrate 12 and the light shielding pattern 62.

In forming the photomask 60 of FIG. 6, after forming the ion trapping layer 14 on the transparent substrate 12, a series of processes including forming a material layer for forming the light shielding pattern 62 and patterning the light shielding pattern 62 so that a portion of the ion trapping layer 14 is exposed on a region of the transparent substrate 12 are performed.

Figure 7:
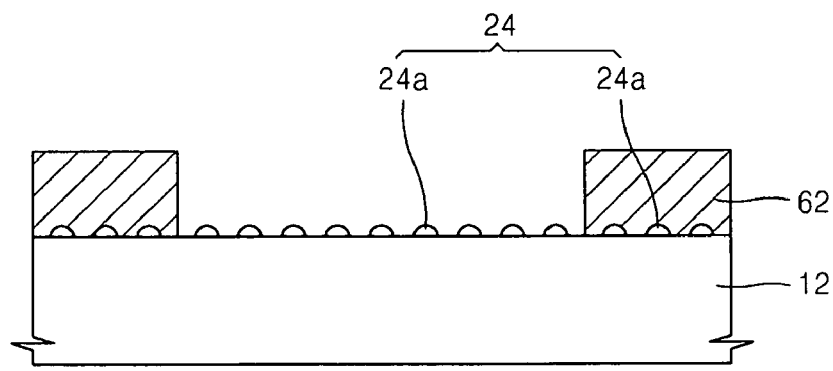
FIG. 7 is a cross-sectional view illustrating a configuration of a photomask according to another embodiment of the present inventive concept.

FIG. 7 is a cross-sectional view illustrating a configuration of a photomask 70 according to another embodiment of the present inventive concept. In FIG. 7, similar to the photomask 60 of FIG. 6, the photomask 70 has a BM structure. In FIG. 7, like reference numerals refer to like elements of FIGS. 1 through 6, and thus, detailed descriptions thereof will not be repeated.

Referring to FIG. 7, the photomask 70 according to the embodiment of FIG. 7, similar to the photomask 20 of FIG. 2, includes a transparent substrate 12, a ion trapping layer 24 formed on the transparent substrate 12 to trap ions present on or near the photomask 70, and, similar to the photo mask 60 of FIG. 6, a light shielding pattern 62 formed on the ion trapping layer 24. In the embodiment of FIG. 7, the ion trapping layer 24 comprises a plurality of island-type thin films 24a disposed apart from each other between the transparent substrate 12 and the light shielding pattern 62 similar to the ion trapping layer 24 illustrated in FIG. 2.

In FIGS. 6 and 7, either the ion trapping layer 14 or the ion trapping layer 24 is interposed between the transparent substrate 12 and the light shielding pattern 62.

Figure 8A:
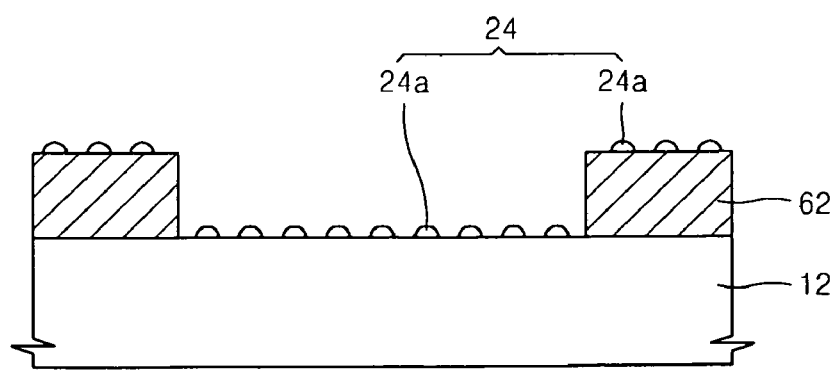
FIGS. 8A and 8B are cross-sectional views illustrating configurations of a photomask according to another embodiment of the present inventive concept.

FIG. 8A is a cross-sectional view illustrating a configuration of a photomask 80 according to another embodiment of the present inventive concept. In FIG. 8A, the photomask 80 has a BM structure, similar to the photomask 60 of FIG. 6. In FIG. 8A, like reference numerals refer to like elements of FIGS. 1 through 7, and thus, detailed descriptions thereof will not be repeated.

Referring to FIG. 8A, the photomask 80 according to the current embodiment, similar to the photomasks 60 and 70 illustrated in FIGS. 6 and 7, includes a transparent substrate 12 and a light shielding pattern 62 formed on the transparent substrate 12. However, in the current embodiment, an ion trapping layer 24 for trapping ions present on a surface of the photomask 80 or near the photomask 80 is formed to simultaneously cover an exposed surface of the transparent substrate 12 and an exposed surface of the light shielding pattern 62. The ion trapping layer 24 illustrated in FIG. 8A, similar to the ion trapping layer 24 illustrated in FIG. 2, comprises a plurality of island-type thin films 24a disposed apart from each other on the exposed surface of the transparent substrate 12 and the exposed surface of the light shielding pattern 62.

Figure 8B:
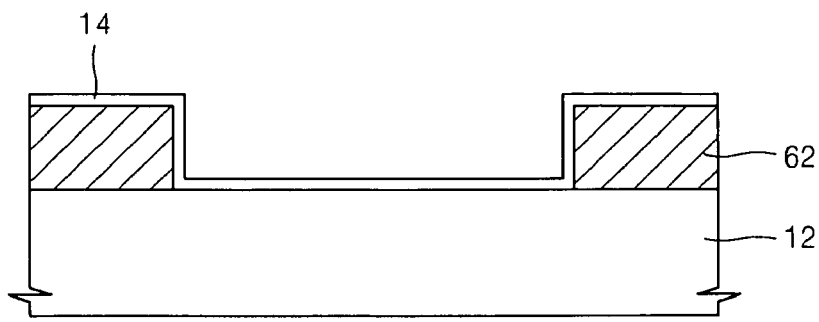

In FIG. 8A, the ion trapping layer 24 comprises a plurality of island-type thin films 24a like the ion trapping layer 24 illustrated in FIG. 2; however, this embodiment of the present inventive concept is not limited thereto. For example, as illustrated in FIG. 8B, instead of the ion trapping layer 24 illustrated in FIG. 8A, a photomask 81 includes the ion trapping layer 14 having a film shape as illustrated in FIG. 1 formed on the entire exposed surface of the transparent substrate 12 and the entire exposed surface of the light shielding pattern 62.

Figure 9A:
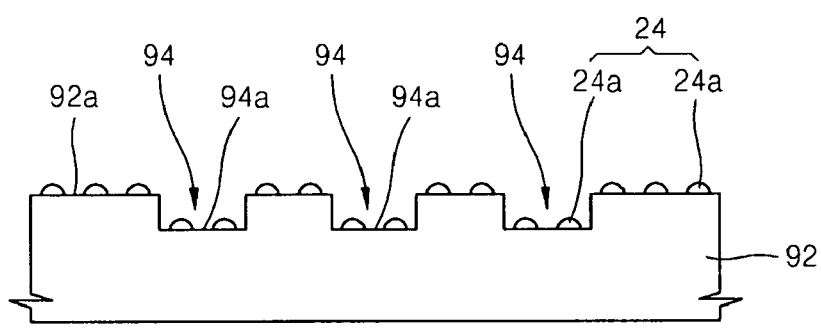
FIGS. 9A and 9B are cross-sectional views illustrating configurations of a photomask according to another embodiment of the present inventive concept.

FIG. 9A is a cross-sectional view illustrating a configuration of a photomask 90 according to another embodiment of the present inventive concept. In FIG. 9A, the photomask 90 has a chromeless phase shift pattern mask structure in which a phase shift unit 94 having a trench shape for phase shifting is formed in a light transmitting region of a transparent substrate 92. In FIG. 9A, like reference numerals refer to like elements of FIGS. 1 and 2, and thus, detailed descriptions thereof will not be repeated.

Referring to FIG. 9A, the photomask 90 according to the current embodiment includes a transparent substrate 92 in which the phase shift unit 94 having a trench shape is formed and an ion trapping layer 24 formed on the transparent substrate 92 to trap ions present on or near the photomask. The transparent substrate 92 may be formed of quartz.

In forming the photomask 90 of FIG. 9A, a series of processes are performed. For example, the phase shift unit 94 which includes a plurality of trenches is formed by forming the trenches having a bottom surface 94a lower than a top surface 92a of the transparent substrate 92 by etching a portion of the light transmitting region of the transparent substrate 92. Then the ion trapping layer 24 covering the top surface 92a of the transparent substrate 92 and the bottom surface 94a of the phase shift unit 94 is formed.

In FIG. 9A, the ion trapping layer 24, similar to the ion trapping layer 24 of FIG. 2, includes a plurality of island-type thin films 24a disposed apart from each other on the top surface 92a of the transparent substrate 92 and the bottom surface 94a of the phase shift unit 94.

Figure 9B:
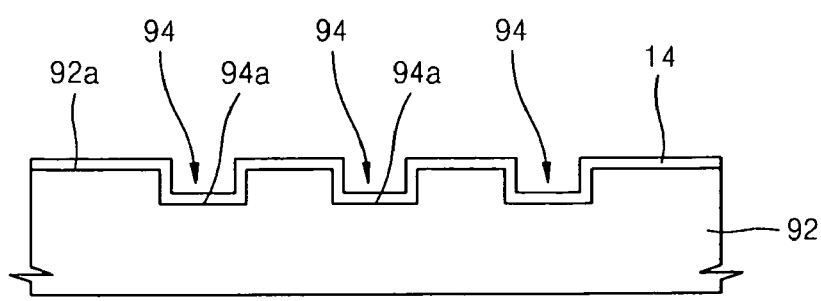

In FIG. 9A, the ion trapping layer 24 comprises a plurality of island-type thin films 24a like the ion trapping layer 24 illustrated in FIG. 2; however, this embodiment of the present inventive concept is not limited thereto. For example, as illustrated in FIG. 9B, instead of the ion trapping layer 24 illustrated in FIG. 9A, a photomask 91 includes the ion trapping layer 14 having a film shape as illustrated in FIG. 1 formed on the top surface 92a of the transparent substrate 92 and the bottom surface 94a of the phase shift unit 94.

The photomasks 10 through 91 according to the embodiments of the present inventive concept illustrated in FIGS. 1 through 9B include either the ion trapping layer 14 having a film shape that entirely covers a predetermined region of a main surface of the transparent substrate 12 or 92 or the ion trapping layer 24 that comprises a plurality of island-type thin films 24a disposed apart from each other on the main surface of the transparent substrate 12 or 92.

The ion trapping layers 14 and 24 hinder the mobility of residual ions remaining on surfaces of the photomasks 10 through 91 or near the photomasks 10 through 91 by trapping the residual ions through a strong molecular interaction with the residual ions. As a result, the residual ions that result in haze defects during an exposure process using the photomasks 10 through 91 are gathered on a predetermined point of the ion trapping layer 14 and 24 and form defect seeds. Thus, the process of transformation of the residual ions to haze defects on the photomasks 10 through 91 is repressed. Accordingly, a time at which the haze defects are generated on the photomasks 10 through 91 after an exposure process can be effectively delayed and the time delay of the generation of the haze defect can be effectively maintained.

When the ion trapping layers 14 and 24 are formed of a conductive material, electron distribution on the photomasks 10 through 91 can be delocalized by the ion trapping layers 14 and 24. As a result, charges are concentrated on a predetermined region of the photomasks 10 through 91, and, thus, the possibility of the photomasks 10 through 91 being contaminated by the concentration of residual ions having an opposite charge or remaining materials on a particular location is prevented.

The ion trapping layers 14 and 24 form a strong bond between residual ions such as sulfur ions or ammonium ions, which are main components that generate haze defects on the photomasks 10 through 91, and, thus, the generation of haze defects is delayed by repressing the behavior of residual ions. The strong bonding between the ion trapping layers 14 and 24 and the residual ions is based on an interaction between Highest Occupied Molecular Orbitals (HOMOs) and Lowest Occupied Molecular Orbitals (LOMOs) of the residual ions that generate haze defects and electron and hole transfer between conduction band (CB) and valence band (VB) of materials that constitute the ion trapping layers 14 and 24. Thus, the ion trapping layers 14 and 24 may be formed of a material having a structure that provides a smooth electron transfer between residual ions that generate haze defects. That is, in order to interrupt the behavior of the residual ions by forming a strong bond with the residual ions that generate haze defects, the ion trapping layers 14 and 24 are formed of a material having a CB having a similar value to the energy level of HOMOs so that electrons can be smoothly moved in the HOMOs of the ions that generate haze defects and simultaneously having a VB having a similar value to the energy level of LUMOs so that electrons can be smoothly moved in the LUMOs of the ions that generate haze defects.

The ion trapping layers 14 and 24 of the photomasks 10 through 91 are formed on surfaces of the transparent substrate 12 and 92 or are interposed between the transparent substrate 12 and the transmission control pattern 32 or between the transparent substrate 12 and the light shielding pattern 62. The ion trapping layers 14 and 24 of the photomasks 10 through 91 according to the embodiments of the present inventive concept have a structure that minimizes the possibility of the ion trapping layers 14 and 24 being washed away by a cleaning solution and/or minimizes the reduction of resistance to haze defects.

The ion trapping layers 14 and 24 repress the behavior of the residual ions remaining around the photomasks 10 through 91 by strongly attracting the residual ions through a chemical interaction. Thus, the generation of haze defects is effectively delayed, and as a result, the lifetime and cleaning interval of the photomasks 10 through 91 is effectively extended.

Figure 10:
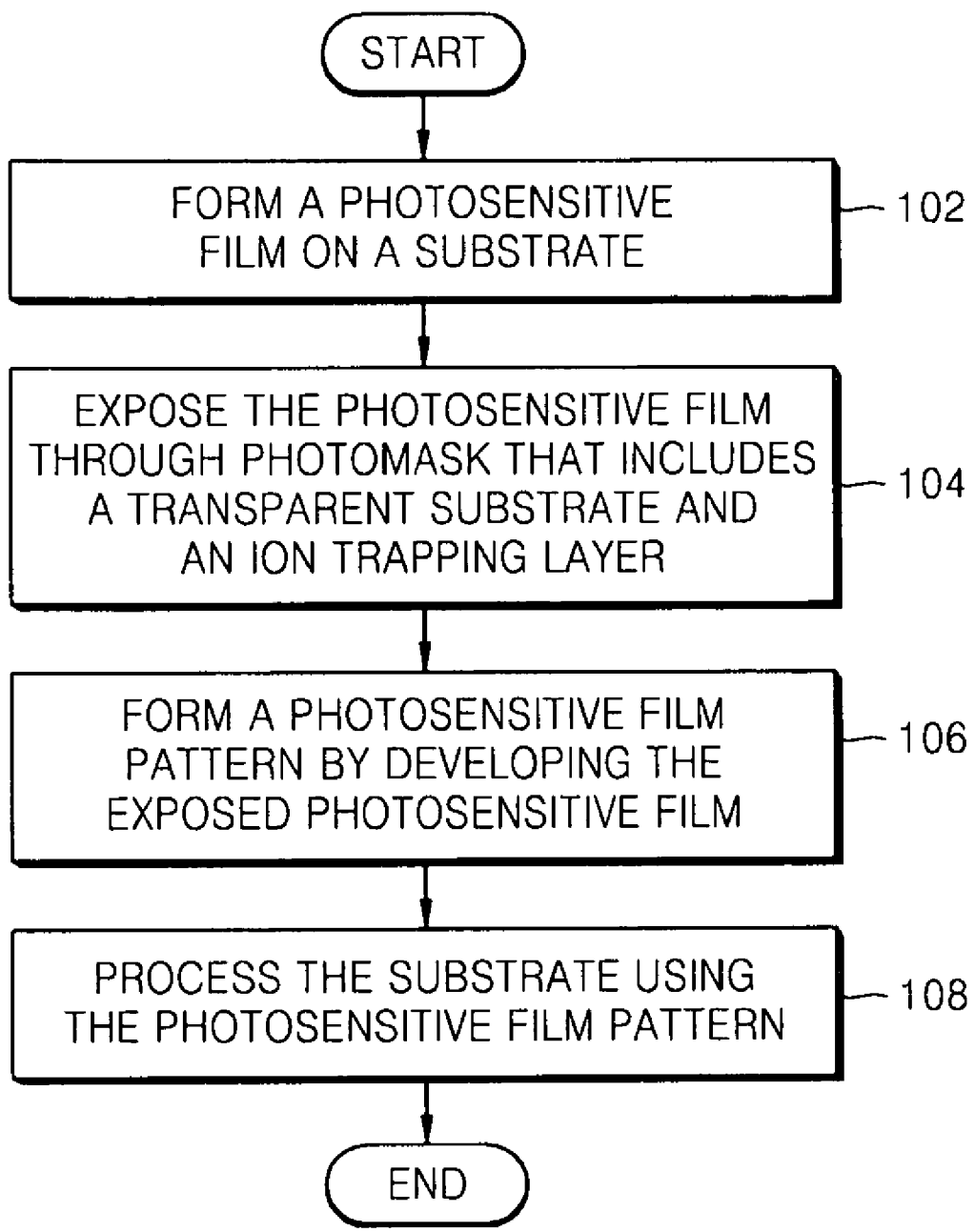
FIG. 10 is a flowchart illustrating a method of manufacturing a semiconductor device, according to an embodiment of the present inventive concept.

FIG. 10 is a flowchart illustrating a method of manufacturing a semiconductor device, according to an embodiment of the present inventive concept.

The method of manufacturing a semiconductor device according to an embodiment of the present inventive concept is described herein with reference to FIG. 10.

In step 102, a photosensitive film is formed on a substrate. The substrate may be a semiconductor substrate. The substrate may have a structure in which predetermined material films are stacked on the semiconductor substrate, or may have a structure in which predetermined unit devices such as transistors, capacitors, and wire lines are formed on the semiconductor substrate.

In step 104, the photosensitive film formed on the transparent substrate is exposed through a photomask according to an embodiment of the present inventive concept described with reference to FIGS. 1 through 9B. That is, the photomask includes an ion trapping layer formed on a predetermined region of the transparent substrate to trap residual ions remaining on the transparent substrate and near the transparent substrate. At this point, the exposure may be performed using a KrF Excimer laser (248 nm), an ArF Excimer laser (193 nm), a $F_2$ Excimer laser (157 nm), or light in an Extreme-ultraviolet (EUV) region as a light source.

In step 106, a photosensitive film pattern is formed on the substrate by developing the exposed photosensitive film.

In step 108, the substrate is processed using the photosensitive film pattern. The process of patterning the substrate may include a process of etching the substrate, a process of injecting ions into the substrate, a process of depositing a material such as an insulating material, a conductive material, or an adhesive material on the substrate, or a process of cleaning the substrate.

In the method of manufacturing a semiconductor device according to the present embodiment of FIG. 10, during the process of exposing the photosensitive film, the photosensitive film on the substrate is exposed using a photomask that includes an ion trapping layer. Thus, an exposure process that has a high resistance to haze defects, which are defects generated by residual ions remaining on a surface of the photomask or near the photomask, is performed. Also, when an exposure process is performed using a light source having a short wavelength with high energy such that a minute pattern on the substrate is formed, pattern failure due to haze defects during an exposure process for forming a photosensitive film pattern on a substrate is prevented, and, therefore, high-resolution patterns with a desired shape are formed on the substrate.

Evaluation Experiment 1

Comparison of the Amount of Residual Ions Before and After Exposure

Figure 11A:
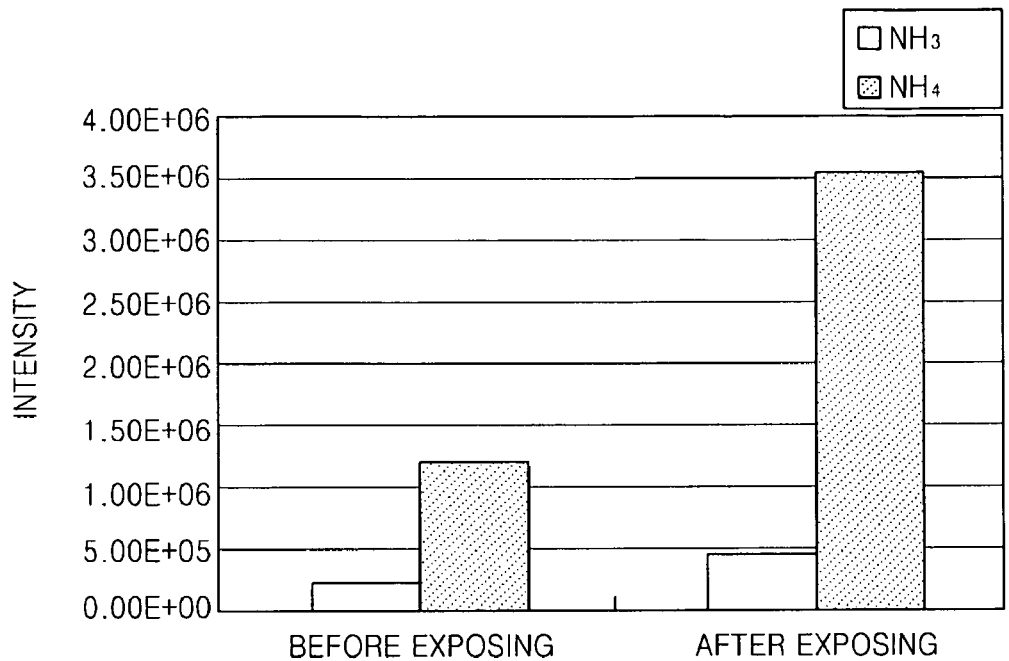
FIGS. 11A and 11B are graphs respectively illustrating a comparison of measured amounts of ions detected on surfaces of photomasks before and after an exposure process when a photolithographic process is performed using conventional photomasks.
Figure 11B:
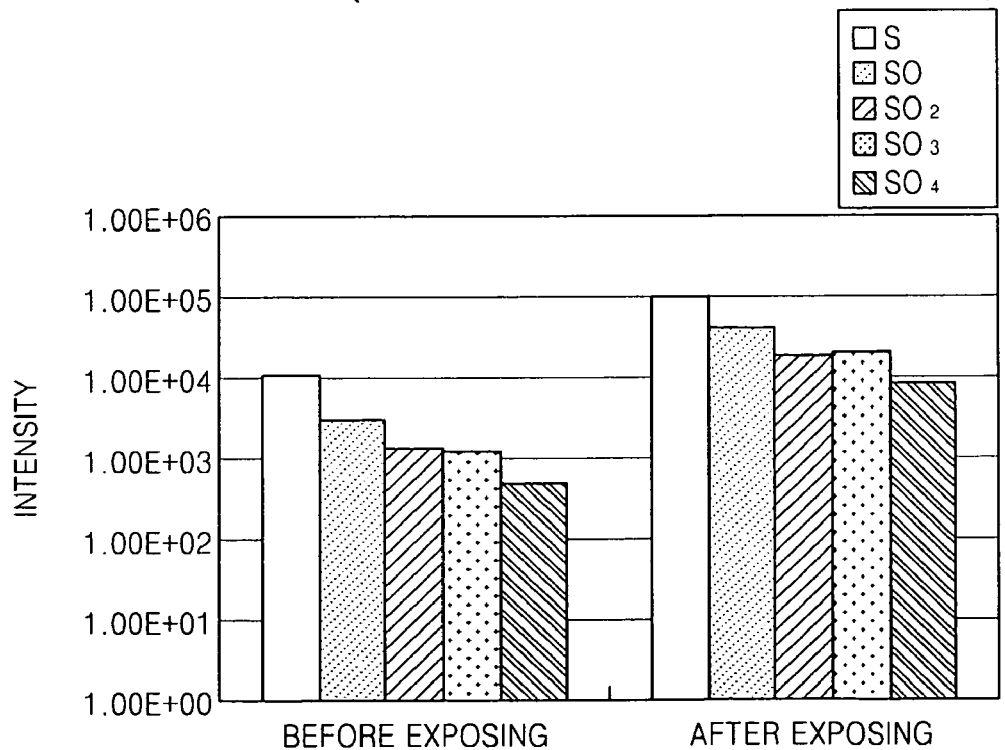

FIGS. 11A and 11B are graphs respectively illustrating the comparison of measured amounts of ions that can be detected on surfaces of photomasks before and after an exposure process when a photolithographic process is performed using conventional photomasks. More specifically, FIG. 11A is a graph illustrating the comparison of detected amounts of positive ions, that is, $NH_3$ and $NH_4$ ions respectively before and after performing an exposure process with respect to a quartz substrate, and FIG. 11B is a graph illustrating the comparison of detected amounts of negative ions, that is, S, SO, $SO_2$, $SO_3$, and $SO_4$ ions respectively before and after performing an exposure process with respect to a quartz substrate. A Time of Flight Secondary Ion Mass Spectrometer (TOF-SIMS) was used to analyze the components on the surfaces of the quartz substrates of FIGS. 11A and 11B.

From the measurement results of FIGS. 11A and 11B, it can be seen that the amount of ions that can generate haze defects on the surface of the quartz substrate is increased after performing an exposure process with respect to the quartz substrate when compared to the amount of ions before performing the exposure process.

Evaluation Experiment 2

The Amount Variation of the Detected Residual Ions According to Storage Time

Figure 12A:
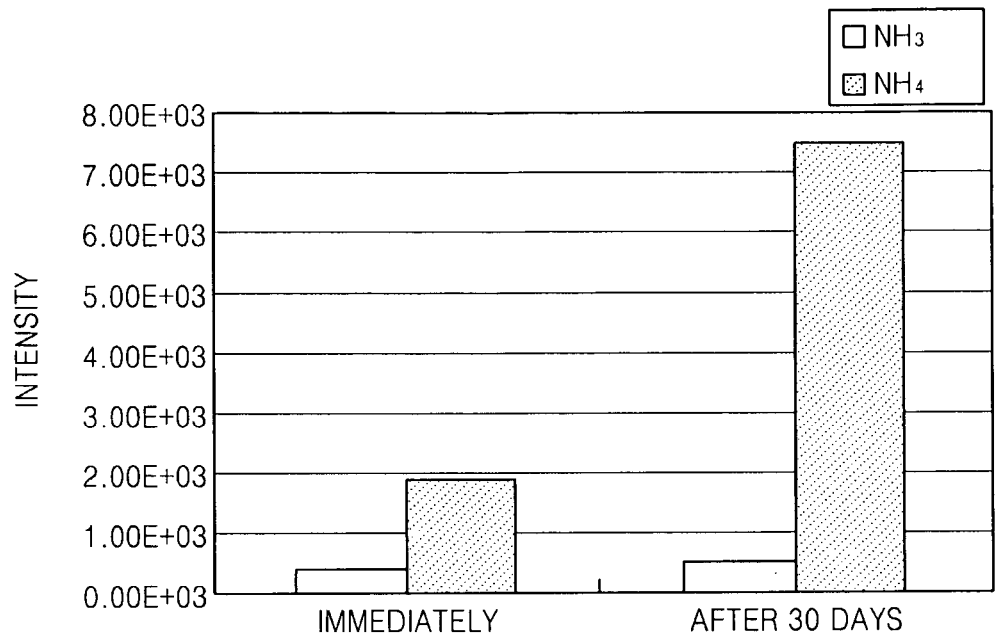
FIGS. 12A and 12B are graphs respectively illustrating evaluation results of a variation in amounts of residual ions according to storage time of conventional photomasks.
Figure 12B:
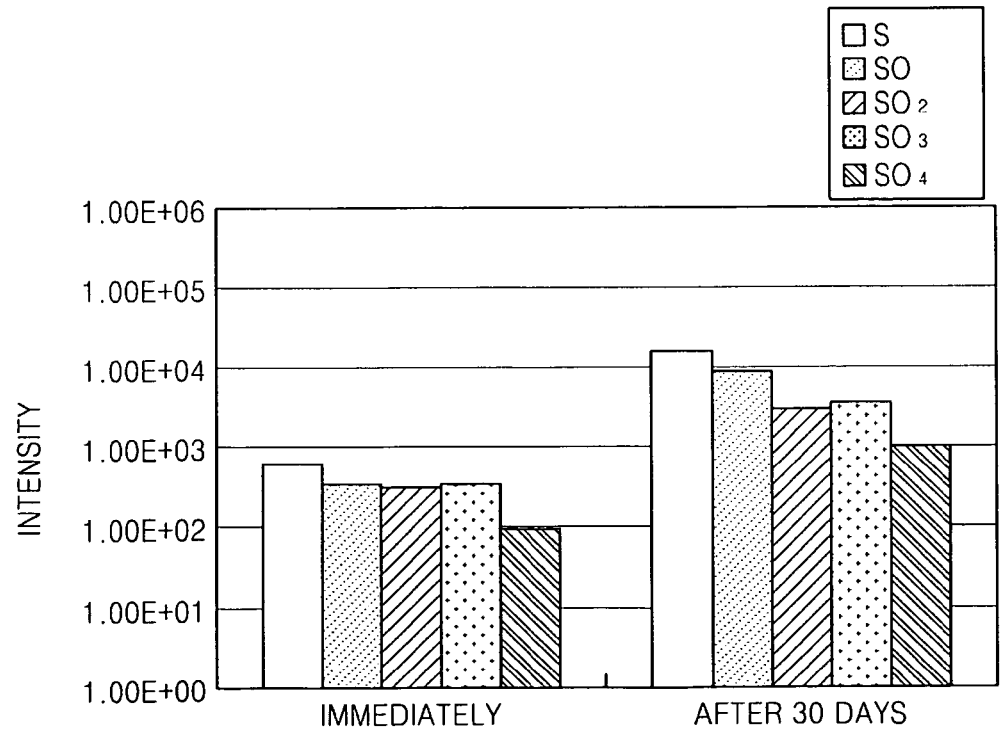

FIGS. 12A and 12B are graphs respectively illustrating the evaluation results of the amount variation of residual ions according to storage time of conventional photomasks. More specifically, FIG. 12A is a graph illustrating the comparison of detected amounts of positive ions, that is, $NH_3$ and $NH_4$ ions on a surface of the quartz substrate when the residual ions are measured immediately after manufacturing the quartz substrate and after storing the quartz substrate for 30 days, respectively, and FIG. 12B is a graph illustrating the comparison of detected amounts of negative ions, that is, S, SO, $SO_2$, $SO_3$, and $SO_4$ ions on a surface of the quartz substrate when the residual ions are measured immediately after manufacturing the quartz substrate and after storing the quartz substrate for 30 days. A TOF-SIMS was used to analyze the components on the surfaces of the quartz substrate of FIGS. 11A and 11B.

From the measurement results of FIGS. 12A and 12B, it can be seen that the amount of ions that can generate haze defects on the surface of the quartz substrate is increased when the quartz substrate is stored for a long time compared to the case when the residual ions are measured immediately after manufacturing the quartz substrate.

Evaluation Experiment 3

The Effect of Ion Trapping Layer with Respect to Transmittance of a Photomask

In evaluating the effect of an ion trapping layer with respect to the variation of transmittance of a photomask that includes the ion trapping layer according to an embodiment of the present inventive concept, the transmittances of a photomask in which an ion trapping layer was formed on a quartz substrate and a comparative conventional photomask comprising a quartz substrate on which an ion trapping layer is not formed were measured, respectively.

In order to form the ion trapping layer on the quartz substrate of the photomask according to an embodiment of the present inventive concept, an ion trapping layer was formed using an Al/Cr mixed film in which Al and Cr were mixed in a volume ratio of 1:1 on the quartz substrate by simultaneously depositing Al and Cr on the quartz substrate using a physical deposition process. The deposition process for forming the Al/Cr mixed film was performed for approximately 250 seconds. The obtained Al/Cr mixed film had a thickness of less than 1 nm.

The transmittance of the photomask manufactured using the method described above and that of the comparative conventional photomask were respectively measured a plurality of times. As a result, the photomask according to an embodiment of the present inventive concept had an average transmittance of approximately 87.519% within a measuring error range of approximately ±0.2%, and the comparative conventional photomask had an average transmittance of approximately 87.389%. The transmittance difference between the photomask according to an embodiment of the present inventive concept and the comparative conventional photomask lies within a measuring error range.

From the above result, it can be seen that the ion trapping layer of the photomask according to an embodiment of the present inventive concept does not affect the transmittance of the photomask.

Evaluation Experiment 4

Comparison of the Amount of Residual Ions Using Photmasks With and Without an Ion Trapping Layer In evaluating the ion trapping effect of a photomask that includes an ion trapping layer according to an embodiment of the present inventive concept, an amount of residual ions on a surface of the photomask according to an embodiment of the present inventive concept in which the ion trapping layer was formed on a quartz substrate was compared to an amount of residual ions on a surface of a comparative conventional photomask that included a quartz substrate on which an ion trapping layer was not formed.

For the current evaluation, a photomask manufactured using the same method as that used to manufacture the photomask used in Evaluation Example 3 and a comparative conventional photomask that included a quartz substrate on which an ion trapping layer was not formed were used.

Figure 13:
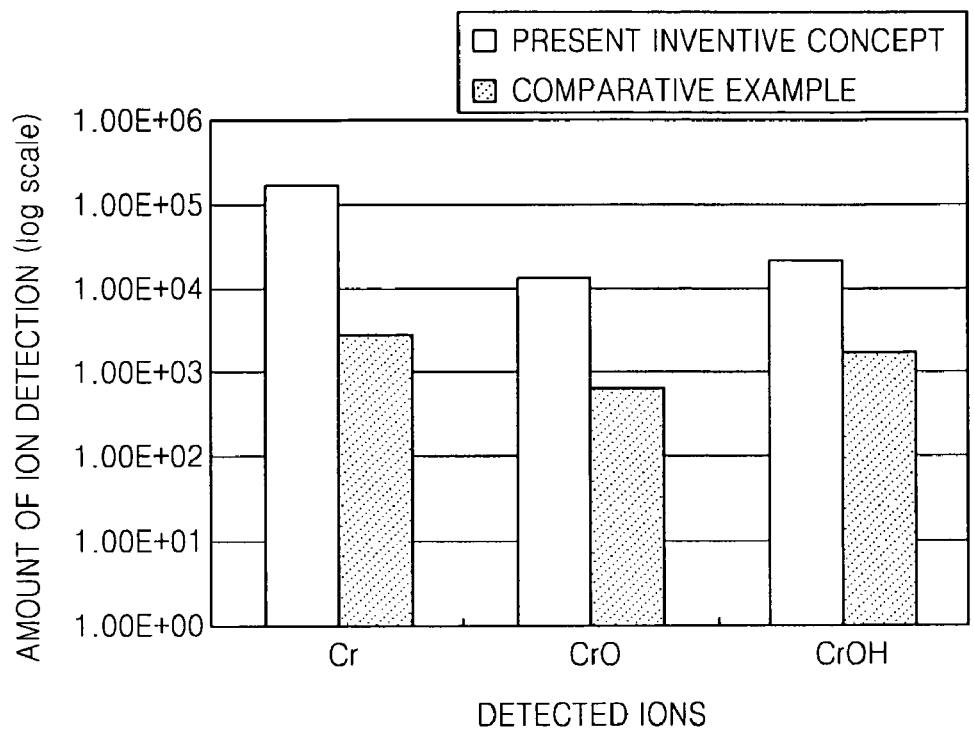
FIG. 13 is a graph illustrating a comparison of an amount of residual ions detected on a surface of a comparative conventional photomask and a surface of a photomask according to an embodiment of the present inventive concept, respectively.

FIG. 13 is a graph illustrating the comparison of an amount of residual ions detected on a surface of a comparative conventional photomask and a surface of a photomask according to an embodiment of the present inventive concept, respectively. In obtaining the evaluation of FIG. 13, components on the surface of the comparative conventional photomask and the surface of the photomask according to an embodiment of the present inventive concept were analyzed using a TOF-SIMS.

As illustrated in FIG. 13, when the amount of an identical kind of residual ions is compared, the amount of detected residual ions in the photomask according to an embodiment of the present inventive concept is greater than that of the comparative conventional photomask. As illustrated in FIG. 13, in the photomask according to an embodiment of the present inventive concept, an amount of trapped residual ions greater than that of the comparative conventional photomask is obtained since the ions are trapped in an ion trapping layer.

Evaluation Experiment 5

Evaluation of the Amount of Dose at Which the Generation of Haze Defects Begins During an Exposure In evaluating a time at which a haze defect is generated on a photomask that includes an ion trapping layer according to an embodiment of the present inventive concept, an amount of doses at which the haze defect is generated was confirmed and compared by applying energy on a surface of a photomask in which an ion trapping layer according to an embodiment of the present inventive concept was formed on a quartz substrate and on a surface of a comparative conventional photomask in which an ion trapping layer was not formed on a quartz substrate, respectively, using an exposure accelerator.

In conducting this evaluation, a photomask manufactured using the same method as that used to manufacture the photomask used in Evaluation Example 3 and a comparative conventional photomask that included a quartz substrate on which an ion trapping layer was not formed are used.

Figure 14A:
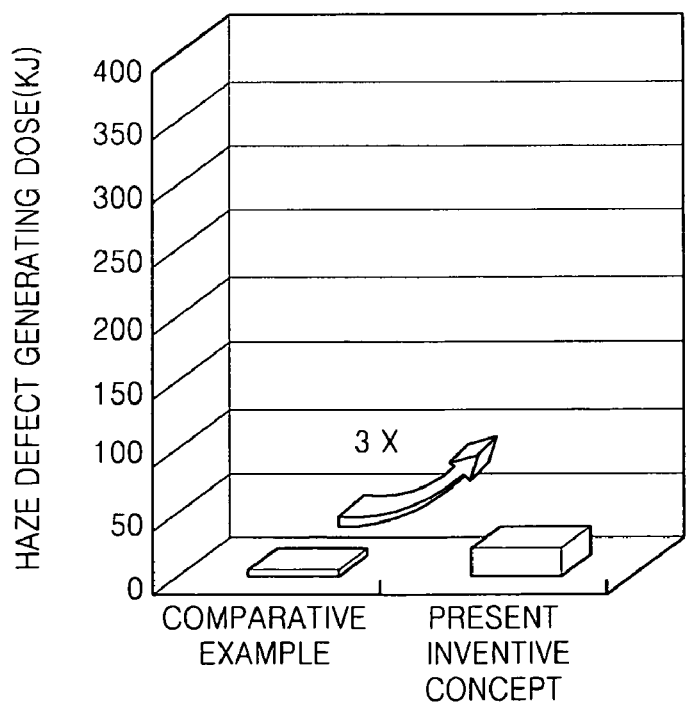
FIG. 14A is a graph illustrating a result of a confirmation of a time at which a haze defect is caused when a comparative conventional photomask and a photomask according to an embodiment of the present inventive concept, respectively, are exposed using an exposure accelerator after respectively cleaning the comparative conventional photomask and the photomask according to an embodiment of the present inventive concept.

FIG. 14A is a graph illustrating a result of a confirmation of a time at which a haze defect was generated when a photomask according to an embodiment of the present inventive concept and a comparative conventional photomask, respectively, were exposed using an exposure accelerator after cleaning the photomask according to an embodiment of the present inventive concept and comparative conventional photomask for approximately 30 minutes using a sulfur solution.

As illustrated in FIG. 14A, in the comparative conventional photomask, generation of a haze defect begins at a dose of approximately 7 KJ; however, in the photomask according to an embodiment of the present inventive concept, generation of a haze defect begins at a dose of approximately 23 KJ. That is, as illustrated in FIG. 14A, an amount of dose at which the haze defect begins in the photomask according to an embodiment of the present inventive concept is approximately three times greater than that in the comparative conventional photomask. From these results, in the case of the photomask including an ion trapping layer according to an embodiment of the present inventive concept, the time at which a haze defect is generated is delayed during an exposure process due to the ion trapping layer.

Figure 14B:
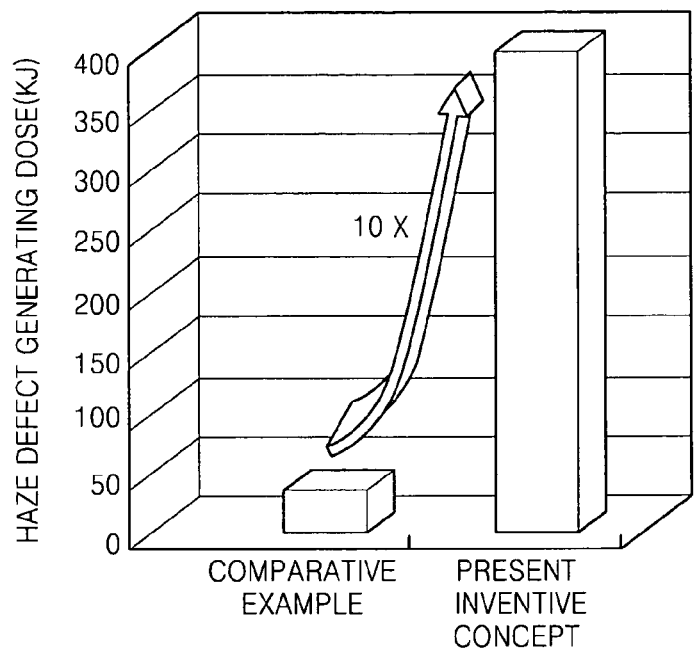
FIG. 14B is a graph illustrating a result of a confirmation of a time at which a haze defect is caused when a photomask according to an embodiment of the present inventive concept and a comparative conventional photomask are exposed using an exposure accelerator after performing another cleaning process with respect to the photomask according to an embodiment of the present inventive concept and the comparative conventional photomask, respectively.

FIG. 14B is a graph illustrating a result of a confirmation of a time at which a haze defect is generated when a photomask according to an embodiment of the present inventive concept and a comparative conventional photomask were exposed using an exposure accelerator after performing a cleaning process different from the cleaning process in FIG. 14A with respect to the comparative conventional photomask and the photomask according to an embodiment of the present inventive concept, respectively.

In obtaining the evaluation result of FIG. 14B, after performing a cleaning process with respect to a photomask according to an embodiment of the present inventive concept and a comparative conventional photomask for approximately 30 minutes using a sulfur solution, a series of cleaning processes were performed. That is, an ashing process that accompanies an $O_2$ plasma treatment was performed for approximately 3 minutes and a process of heating the photomasks was performed for approximately one hour on a hot plate using a W lamp. Subsequently, the time at which a haze defect was generated on the photomask according to an embodiment of the present inventive concept and the comparative conventional photomask was confirmed by respectively performing an exposure process on the photomask according to an embodiment of the present inventive concept and the comparative conventional photomask after the series of cleaning processes was performed using an exposure accelerator.

Referring to FIG. 14B, in the case of the comparative conventional photomask, generation of a haze defect begins at a dose of approximately 35 KJ; however, in the case of the photomask according to an embodiment of the present inventive concept, generation of a haze defect begins at a dose of approximately 400 KJ. That is, in the case of the photomask according to an embodiment of the present inventive concept, the dose at which a haze defect is generated is approximately ten times greater than that in the comparative conventional photomask. From these results, in the case of the photomask including an ion trapping layer according to an embodiment of the present inventive concept, the time at which a haze defect is generated in a photomask can be delayed during an exposure process due to the ion trapping layer.

As illustrated in FIGS. 14A and 14B, in a photomask according to an embodiment of the present inventive concept, a haze defect is generated at a relatively high exposure dose since the generation of the haze defect is delayed in the photomask during an exposure process due to an ion trapping layer. Accordingly, even if an exposure process is performed in an environment in which ions that result in haze defects are present, a desired exposure process can be stably performed without causing haze defects. This is because the time at which haze defects are generated is delayed in the exposure process by using a photomask according to an embodiment of the present inventive concept. Thus, not only the lifetime of the photomask can be increased, but also the mass production efficiency can be increased since a cleaning interval of the photomask used in the exposure process is increased, and productivity can be increased by reducing the failure rate of semiconductor devices to be formed.

Evaluation Experiment 6

Evaluation of the Amount of Residual Ions Using Photomasks With and Without an Ion Trapping Layer After Cleaning and a Dose at Which the Generation of a Haze Defect Begins During an Exposure Process In evaluating the effect of an ion trapping layer of a photomask which includes an ion trapping layer according to an embodiment of the present inventive concept, after performing a cleaning process with respect to a photomask in which an ion trapping layer was formed on a quartz substrate according to an embodiment of the present inventive concept, and a comparative conventional photomask in which an ion trapping layer was not formed on the quartz substrate, amounts of residual ions remaining on surfaces of each of the photomask according to an embodiment of the present inventive concept and the comparative conventional photomask were compared. In this experiment, the amounts of $NH_4$ and S ions remaining on the surfaces of the photomask according to an embodiment of the present inventive concept and the comparative conventional photomask were evaluated.

In evaluating the amount of residual ions and the dose of exposure, a photomask manufactured using the same method as that used to manufacture the photomask used in Evaluation Experiment 3 according to an embodiment of the present inventive concept and a comparative conventional photomask including a quartz substrate on which an ion trapping layer was not formed were used. After performing a cleaning process with respect to the photomask according to an embodiment of the present inventive concept and the comparative conventional photomask for approximately 30 minutes using a sulfur solution, a series of cleaning processes were performed, that is, an ashing process that accompanies an $O_2$ plasma treatment was performed for approximately 3 minutes and a process of heating the photomasks was performed for approximately one hour on a hot plate using a W lamp. Subsequently, the evaluation of the amount of $NH_4$ and S ions remaining on surfaces of the photomask according to an embodiment of the present inventive concept and the comparative conventional photomask after the series of cleaning processes was performed. For this evaluation, components on the surfaces of the photomask according to an embodiment of the present inventive concept and the comparative conventional photomask were analyzed using a TOF-SIMS. Also, the times at which a haze defect was generated on the photomask according to an embodiment of the present inventive concept and the comparative conventional photomask were confirmed by respectively performing an exposure process on the photomask according to an embodiment of the present inventive concept and the comparative conventional photomask after the series of cleaning processes was performed using an exposure accelerator.

Figure 15:
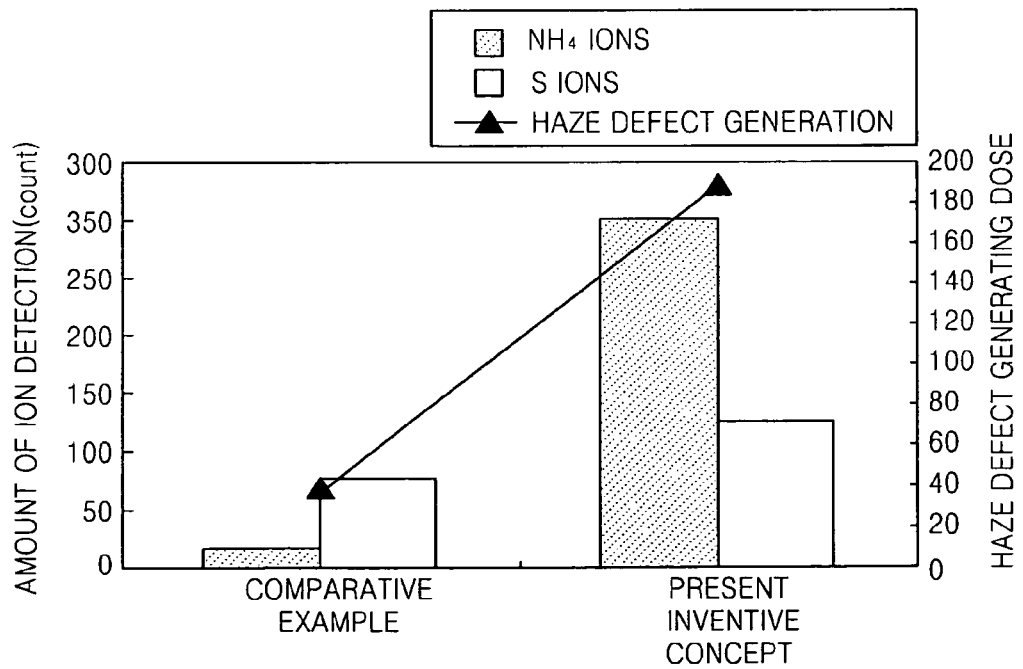
FIG. 15 is a graph illustrating a comparison of an amount of residual ions remaining respectively on surfaces of a photomask according to an embodiment of the present inventive concept and a comparative conventional photomask and a time when a haze defect is caused by respectively exposing the photomask according to an embodiment of the present inventive concept and the comparative conventional photomask using an exposure accelerator.

FIG. 15 is a graph illustrating a comparison of an amount of residual ions remaining respectively on surfaces of a photomask according to an embodiment of the present inventive concept and a comparative conventional photomask and the time at which a haze defect was generated by respectively performing an exposure process on the photomask according to an embodiment of the present inventive concept and the comparative conventional photomask using an exposure accelerator.

In FIG. 15, when amounts of identical kinds of ions are compared, the amount of detected ions in the photomask according to an embodiment of the present inventive concept is greater than that in the comparative conventional photomask. However, the amount of dose at which a haze defect is generated is greatly increased in the photomask according to an embodiment of the present inventive concept when compared to the comparative conventional photomask.

From the results of FIG. 15, in a photomask according to an embodiment of the present inventive concept, the amount of ions remaining on the photomask is greater than that in the comparative conventional photomask since the ions are trapped in an ion trapping layer; however, as illustrated in FIG. 15, the resistance to haze defects is greatly increased in the photomask according to an embodiment of the present inventive concept. That is, as illustrated in FIG. 15, a photomask according to an embodiment of the present inventive concept represses the residual ions from generating haze defects since an ion trapping layer formed on the photomask according to an embodiment of the present inventive concept traps the residual ions.

While the present inventive concept has been particularly shown and described with reference to exemplary embodiments thereof, it will be understood that various changes in form and details may be made therein without departing from the spirit and scope of the following claims.

What is claimed is:

1. A photomask comprising:
   a transparent substrate; and
   an ion trapping layer formed on a first region of the transparent substrate to trap ions present near the transparent substrate, wherein:
   the transparent substrate has a first transmittance with respect to light,
   the first region of the transparent substrate on which the ion trapping layer is formed has a second transmittance with respect to the light; and
   the second transmittance has a value within a range of ±1% of the first transmittance.

2. The photomask of claim 1, wherein the ion trapping layer has a thickness D in a range of 0<D<1 nm.

3. The photomask of claim 1, wherein the ion trapping layer comprises a thin film that completely covers the first region of the transparent substrate.

4. The photomask of claim 1, wherein the ion trapping layer comprises a plurality of island-type thin films disposed apart from each other on the first region of the transparent substrate.

5. The photomask of claim 1, wherein the first region of the transparent substrate comprises an entirety of a main surface of the transparent substrate.

6. The photomask of claim 1, wherein the first region of the transparent substrate comprises a portion of a main surface of the transparent substrate.

7. The photomask of claim 1, further comprising a transmission control pattern that is formed on the first region of the transparent substrate, wherein the transmission control pattern comprises a material different from the material used to form the transparent substrate.

8. The photomask of claim 7, wherein the transmission control pattern comprises at least one pattern selected from the group consisting of a light shielding pattern and a phase shift pattern.

9. The photomask of claim 7, wherein the ion trapping layer is formed on the transmission control pattern.

10. The photomask of claim 7, wherein the ion trapping layer is formed to simultaneously cover an exposed surface of the transparent substrate and an exposed surface of the transmission control pattern.

11. The photomask of claim 7, wherein the ion trapping layer is interposed between the transparent substrate and the transmission control pattern.

12. The photomask of claim 1, wherein the first region of the transparent substrate comprises a phase shift unit that has a trench shape and has a bottom surface lower than a top surface of the first region.

13. The photomask of claim 12, wherein the ion trapping layer is formed respectively on the top surface of the first region of the transparent substrate and on the bottom surface of the phase shift unit.

14. The photomask of claim 1, wherein the ion trapping layer comprises a metal or a metal oxide.

15. The photomask of claim 14, wherein the ion trapping layer comprises at least one metal selected from the group consisting of Cr, Pt, Cu, Ni, Au, Ag, Mg, Co, Zn, Al, oxides of these metals, and a combination thereof.

16. The photomask of claim 1, wherein the ion trapping layer comprises a conductive polymer.

17. The photomask of claim 16, wherein the ion trapping layer comprises at least one of (poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), and poly(para-phenylene vinylene)s.

18. The photomask of claim 1, wherein the ion trapping layer comprises a ceramic.

19. The photomask of claim 18, wherein the ion trapping layer comprises at least one of SrFeCoO, (La, Sr)(Co, Fe)O, and BiSrCrCuO.

20. A method of manufacturing a semiconductor device, comprising:

forming a photosensitive film on a substrate;

exposing the photosensitive film through a photomask comprising a transparent substrate and an ion trapping layer formed on a first region of the transparent substrate to trap ions present near the transparent substrate, wherein the transparent substrate has a first transmittance with respect to light, the first region of the transparent substrate on which the ion trapping layer is formed has a second transmittance with respect to the light, and the second transmittance has a value within a range of ±1% of the first transmittance;

forming a photosensitive film pattern by developing the exposed photosensitive film; and processing the substrate using the photosensitive film pattern.

21. The method of claim 20, wherein the exposing of the photosensitive film is performed using at least one of a KrF Excimer laser (248 nm), an ArF Excimer laser (193 nm), a $F_2$ Excimer laser (157 nm), and light in an Extreme-ultraviolet (EUV) region.

22. The method of claim 20, wherein the processing of the substrate is performed using one process selected from the group consisting of etching the substrate, injecting ions into the substrate, depositing a material on the substrate, and cleaning the substrate.

* * * * *